(12) United States Patent
Ahmad et al.

(10) Patent No.: US 9,086,267 B2
(45) Date of Patent: Jul. 21, 2015

(54) REAL TIME STRAIN SENSING SOLUTION

(71) Applicant: Cisco Technology, Inc., San Jose, CA (US)

(72) Inventors: Mudasir Ahmad, San Jose, CA (US); Weidong Xie, San Ramon, CA (US); Qiang Wang, Huzhou (CN)

(73) Assignee: Cisco Technology, Inc., San Jose, CA (US)

( * ) Notice: Subject to any disclaimer, the term of this patent is extended or adjusted under 35 U.S.C. 154(b) by 83 days.

(21) Appl. No.: 14/013,103

(22) Filed: Aug. 29, 2013

(65) Prior Publication Data

US 2015/0059487 A1    Mar. 5, 2015

(51) Int. Cl.
*G01B 7/16* (2006.01)
*G01N 3/20* (2006.01)
*H05K 1/02* (2006.01)

(52) U.S. Cl.
CPC ............ *G01B 7/22* (2013.01); *H05K 1/0268* (2013.01); *H05K 2201/10151* (2013.01)

(58) Field of Classification Search
CPC ............ H05K 2201/10151; H05K 1/0271; H05K 1/0268; H05K 2203/163; G01R 31/2817
USPC ............ 73/769, 774–778, 788, 780, 862.474, 73/851
See application file for complete search history.

(56) References Cited

U.S. PATENT DOCUMENTS

| | | | |
|---|---|---|---|
| 3,626,256 A * | 12/1971 | Brown | 257/417 |
| 4,104,605 A * | 8/1978 | Boudreaux et al. | 338/2 |
| 4,179,940 A * | 12/1979 | Oertle et al. | 73/808 |
| 4,875,533 A * | 10/1989 | Mihara et al. | 177/144 |
| 4,939,496 A * | 7/1990 | Destannes | 338/2 |
| 5,154,247 A * | 10/1992 | Nishimura et al. | 177/211 |
| 5,306,873 A * | 4/1994 | Suzuki et al. | 174/250 |
| 5,508,676 A * | 4/1996 | Grange et al. | 338/2 |
| 5,526,208 A * | 6/1996 | Hatch et al. | 360/294.1 |
| 5,539,674 A * | 7/1996 | Barbier et al. | 702/138 |
| 5,675,089 A * | 10/1997 | Hawkins | 73/801 |
| 5,969,260 A * | 10/1999 | Belk et al. | 73/773 |
| 6,201,220 B1 * | 3/2001 | Leturia Mendieta | 219/461.1 |
| 6,451,187 B1 * | 9/2002 | Suzuki et al. | 204/426 |
| 6,504,114 B1 * | 1/2003 | Lockery et al. | 177/229 |
| 6,647,797 B2 * | 11/2003 | Miodushevsky | 73/774 |
| 6,948,377 B2 * | 9/2005 | Wingett et al. | 73/795 |
| 7,036,387 B2 * | 5/2006 | Ong et al. | 73/862.637 |
| 7,094,061 B1 * | 8/2006 | Kieffer et al. | 439/65 |
| 7,096,748 B2 * | 8/2006 | Kutlu | 73/862.474 |
| 7,104,138 B2 * | 9/2006 | Otobe et al. | 73/766 |
| 7,621,190 B2 | 11/2009 | Ahmad et al. | |
| 2007/0151358 A1 * | 7/2007 | Chien et al. | 73/790 |

* cited by examiner

*Primary Examiner* — Lisa Caputo
*Assistant Examiner* — Jonathan Dunlap
(74) *Attorney, Agent, or Firm* — Merchant & Gould, P.C.

(57) ABSTRACT

Strain sensing may be provided. First, a strain threshold for a circuit board may be determined. Then a strain capacitor may be selected that will fail when the circuit board is subjected to the strain threshold while the strain capacitor is mounted on the circuit board. The strain capacitor may be ceramic and may be in a commercially available size. The strain capacitor may then be mounted to the circuit board and monitored for failure.

19 Claims, 8 Drawing Sheets

REAL TIME STRAIN SENSING SOLUTION

TECHNICAL FIELD

The present disclosure relates generally to circuit board strain sensing.

BACKGROUND

A Printed Circuit Board Assembly (PCBA) is used to mechanically support and electrically connect electronic components using conductive pathways, tracks, or signal traces etched from copper sheets laminated onto a non-conductive substrate. The electronic components may comprise circuit elements such as capacitors, resistors, or active devices. Over flexing the PCB during manufacture or installation by cause the electronic components or the PCB to fail.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1:
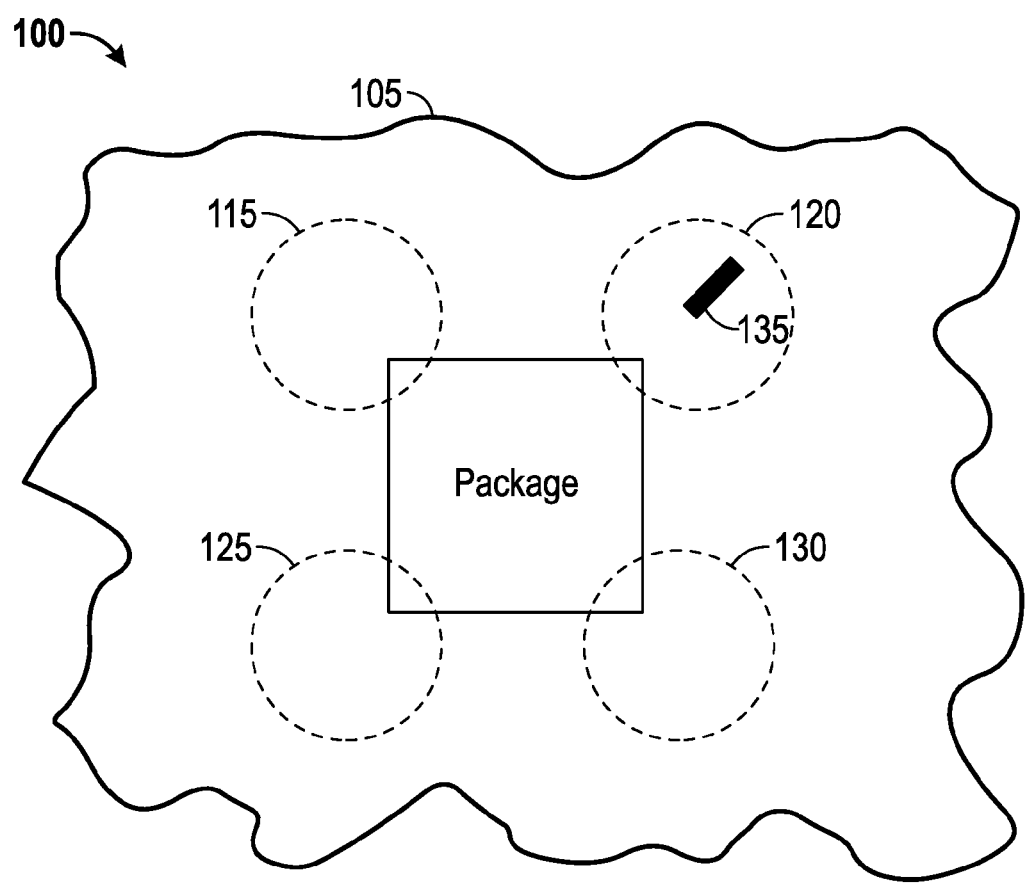
FIG. 1 shows an operating environment.

Strain sensing may be provided. First, a strain threshold for a circuit board may be determined. Then a strain capacitor may be selected that will fail when the circuit board is subjected to the strain threshold while the strain capacitor is mounted on the circuit board. The strain capacitor may be ceramic and may be in a commercially available size. The strain capacitor may then be mounted to the circuit board and monitored for failure.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Printed Circuit Board Assemblies (PCBAs) are becoming more complex and susceptible to mechanical strain induced failures. Mechanical strain can cause several failures during assembly, shipping, handling, and field operation. Such failures due to mechanical strain may occur in solder joints, traces, or in the circuit board itself. It may be important to know when these failures occur in order to determine the cause and to take measures to prevent failures in the future.

Embodiments of the disclosure may provide strain monitoring for circuit boards. Strain monitoring consistent with embodiments of the disclosure may be provided at a lower cost than conventional processes, may not require custom parts or special supplier, and may not need to be calibrated. Moreover, embodiments of the disclosure may be assembled easily in current assembly processes, may detect and record strain-induced failures during assembly, shipping and field use, and may be standardized and used across multiple PCBAs.

FIG. 1 shows an operating environment 100. As shown in FIG. 1, operating environment 100 may comprise a circuit board 105 and a package 110. Package 110 may comprise any type electronic component or circuit element capable of being placed on circuit board 105. Circuit board 105 may include a plurality of high stress regions (e.g., a first high stress region 115, a second high stress region 120, a third high stress region 125, and a fourth high stress region 130.)

A strain capacitor 135 may be disposed on circuit board 105. While strain capacitor 135 is shown to be included in first high stress region 115, strain capacitor 135 may be included in any one of the plurality of high stress regions or anywhere on circuit board 105. A high stress region may comprise a portion of circuit board 105 that may be more susceptible to damage due to straining or flexing circuit board 105 than other portions of circuit board 105.

Figure 2:
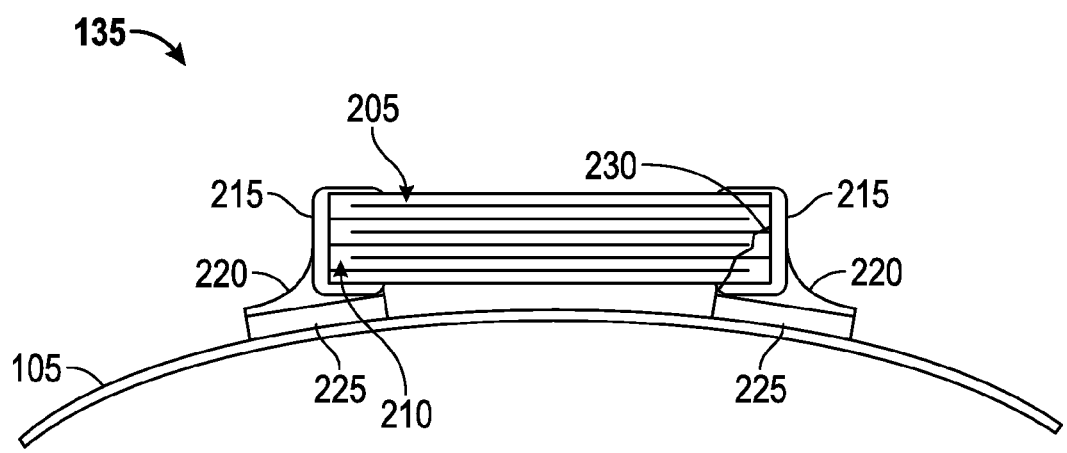
FIG. 2 shows a strain capacitor.

FIG. 2 shows strain capacitor 135 in more detail. As shown in FIG. 2, strain capacitor 135 may comprise electrodes 205, ceramic dielectric 210, and capacitor terminations 215. Strain capacitor 135 may be attached (e.g. mounted) to circuit board 105 through solder joints 220 disposed between solder pads 225 and capacitor terminations 215. As will be discussed in greater detail below, a crack 230 may form through electrodes 205 and ceramic dielectric 210 when circuit board 105 is subjected to a strain threshold while strain capacitor 135 is mounted on circuit board 105. Crack 230 may cause a detectable change in strain capacitor 135's capacitance.

Figure 3:
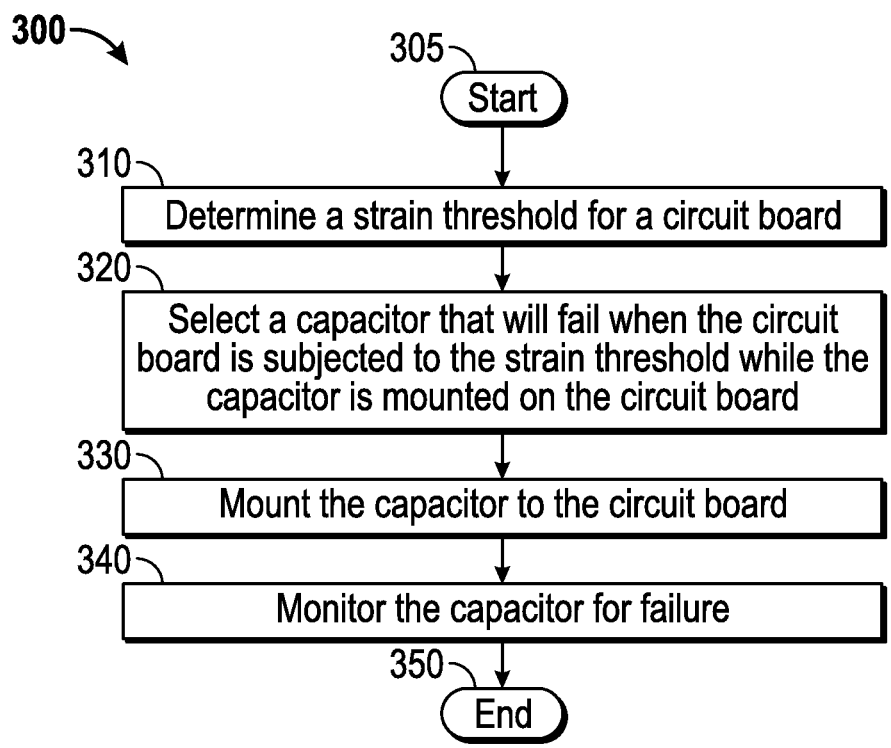
FIG. 3 is a flow chart of a method for providing strain sensing.

FIG. 3 is a flow chart setting forth the general stages involved in a method 300 consistent with an embodiment of the disclosure for providing strain sensing. Ways to implement the stages of method 300 will be described in greater detail below.

Method 300 may begin at starting block 305 and proceed to stage 310 where a strain threshold for circuit board 105 may be determined. For example, there may be a close correlation between force and strain within the variation of experimental error as illustrated in Table 1 below.

TABLE 1

| | | | | Model Data (ue) | | | | Error (%) | | |
|---|---|---|---|---|---|---|---|---|---|---|
| SN | Package Type | Package Size (mm) | Displacement (mm) | Force (N) | Gauge 1 | Gauge 2 | Gauge 3 | Force (N) | Gauge 1 | Gauge 2 | Gauge 3 |
| 1 | HFCBGA | 35 | 8 | 452.28 | 4541 | −5233 | −1644 | 22.18 | 5.77 | −26.23 | 51.68 |
| 2 | HFCBGA | 35 | 9 | 511.88 | 5097 | −5917 | −1872 | 17.58 | .070 | −45.16 | 63.53 |
| 3 | HFCBGA (NSMD) | 45 | 6 | 363.26 | 3709 | −4400 | −1411 | 19.68 | 52.52 | −9.14 | −25.22 |
| 4 | HFCBGA (SMD) | 45 | 8 | 492 | 4943 | −6005 | −1883 | 24.62 | 19.75 | 14.96 | 43.03 |
| 5 | HFCBGA (SMD) | 45 | 9 | 557.16 | 5544 | −6788 | −2150 | 25.74 | 16.89 | 10.36 | 41.35 |
| 6 | HFCBGA (SMD) | 45 | 10 | 625 | 6164 | −7660 | −2433 | 24.57 | 13.17 | 6.88 | 39.46 |
| 7 | FCBGA (Lidless) | 45 | 15.625 | 401.8 | 7778.8 | −8936.5 | −4386 | 31.67 | 2.77 | −11.71 | −9.65 |
| 8 | FCBGA (Lidless) | 45 | 23.4375 | 676.36 | 11386 | −13693 | −6972 | 7.98 | 5.12 | −9.54 | −26.76 |
| 9 | HSBGA | 37.5 | 6 | 346.98 | 3583 | −4046 | −1501 | 33.54 | −11.25 | 36.44 | 19.38 |
| 10 | HSBGA | 37.5 | 7 | 406.7 | 4169 | −4748 | −1778 | 33.61 | −25.52 | 14.07 | 44.97 |
| 11 | HSBGA | 37.5 | 8 | 467.34 | 4752 | −5457 | −2059 | 31.72 | −25.91 | −171.10 | 45.44 |
| 12 | HSBGA | 37.5 | 10 | 592.06 | 5912 | −6895 | −2636 | 28.11 | −18.67 | 36.57 | −16.41 |
| | | | | | | | Average | 25.08 | 2.94 | −12.80 | 22.57 |

Gauge 2, 3 on bottom side of PCB: Gauge 2 at pkg corner; and Gauge 3 at pkg center
Gauge 1 on top side of PCB (far field)

Given a critical joint-strain-to-failure (JFS$_{Crit}$) and an "R" for a given package and PCB combination, a predicted PCB-strain-to-failure can be predicted:
JFS: Joint-Failure-Strain:
The critical strain in the joint that results in failure
PFS: PCB-Failure-Strain:
The critical strain in the PCB that results in failure
R: Joint-to-Board Strain Ratio:
The ratio of joint to board strain $$R = \frac{JFS}{PFS} \rightarrow PFS = \frac{JFS}{R}$$

From experimental data with PCB-strain-to-failure, the critical joint strain (JFS$_{Crit}$) may be estimated from the model to be 0.02 (20,000με). With this critical strain, the PCB-strain-to-failure may be predicted as illustrated in Table 2.

TABLE 2

| | Package | | |
|---|---|---|---|
| Variable | FCBGA 45 mm | HFCBGA 35 mm | HSBGA 37.5 mm |
| R-value | 2.87 | 3.87 | 4.26 |
| Predicted PFS (μs) | 6968.64 | 5167.95 | 4694.83 |
| Experimental PFS (μs) | 9208 | 4541 | 3583 |
| % Error | 24.31 | −13.80 | −31.03 |

The model may predict, within 30% accuracy, the estimated PCB-strain-to-failure. So, given any package and PCB combination, the R-value may be estimated, and then the PCB strain-to-failure may be predicted.

Figure 4A:
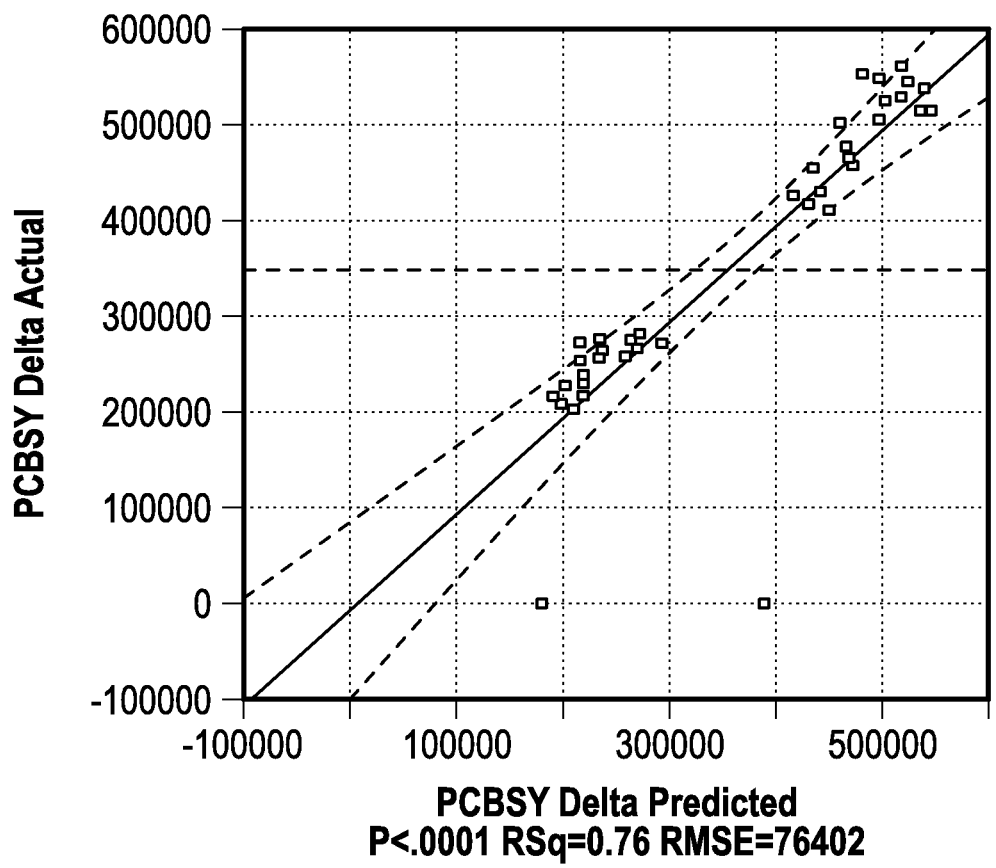
FIGS. 4A, 4B, and 4C show graphs correlating board strain and pad cratering.
Figure 4B:
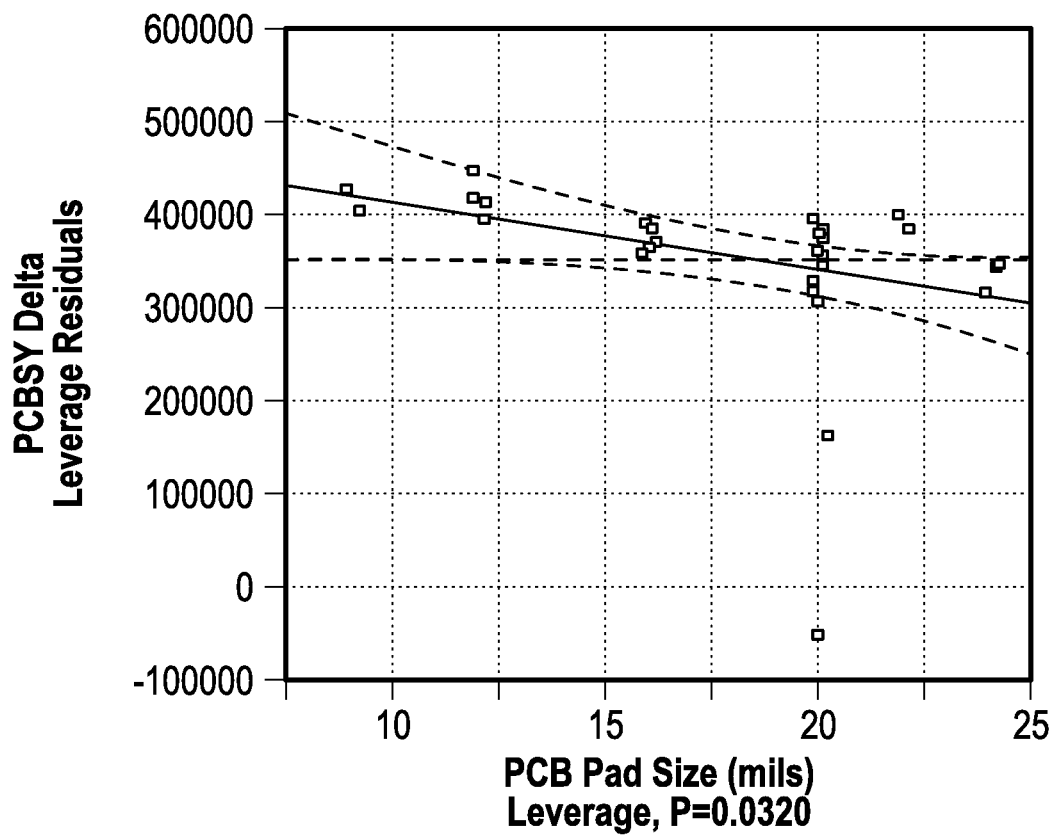
Figure 4C:
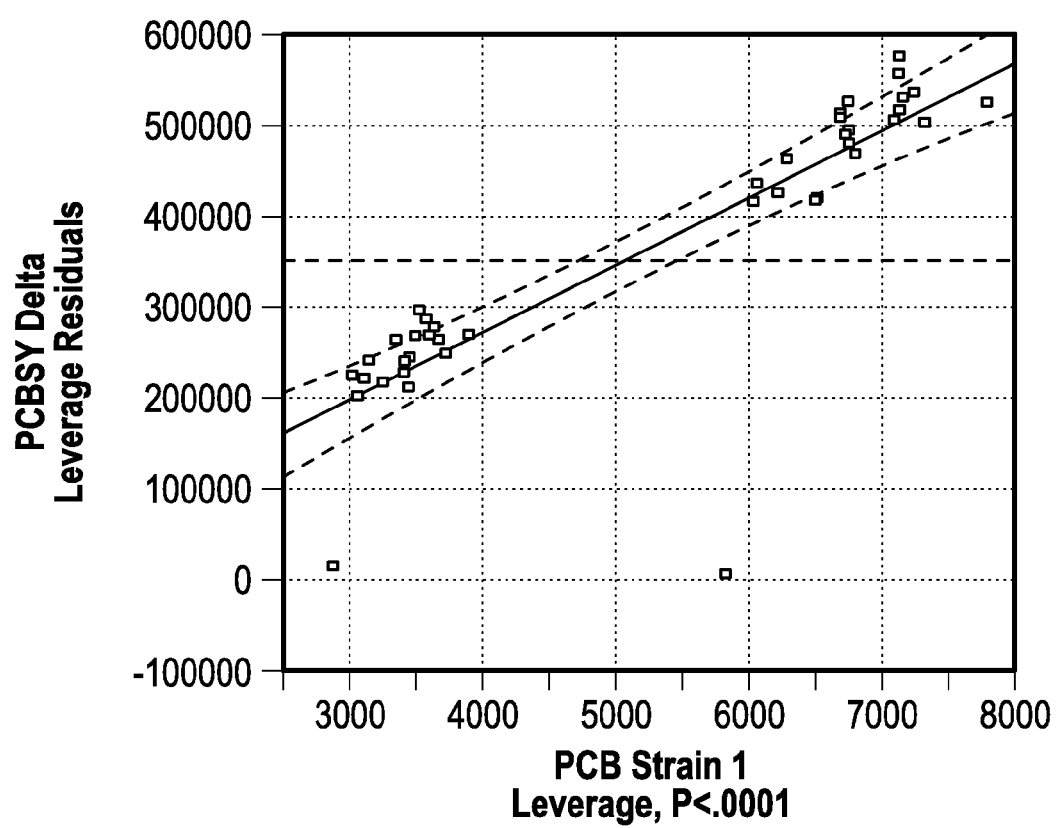

FIGS. 4A, 4B, and 4C show graphs correlating board strain and pad cratering. As supported by the graphs shown in FIGS. 4A, 4B, ad 4C, the strain threshold for circuit board 105 (e.g. the target board strain) may be within a range of 3,000 to 5000με to, for example, prevent cratering. Increasing pad size (e.g. solder pads 225) may reduce PCB tensile stress thus reducing likelihood of cratering. As shown in FIGS. 4A, 4B, and 4C, PCBSY may comprise the stress in the tensile (out-of-plane) direction of the PCB (Y-axis), hence PCBSY.

PCB Pad Cratering Stress=114506.246− 7432.648*PCB Pad Size (mils)+73.96825*PCB Global Strain|(ue)

From stage 310, where the strain threshold for circuit board 105 was determined, method 300 may advance to stage 320 where strain capacitor 135 may be selected that will fail when circuit board 105 is subjected to the strain threshold while strain capacitor 135 is mounted on circuit board 105. For example, strain capacitor 135 may be selected to fail at any target strain level. Consequently, strain capacitor 135's size may be selected to be one that fails at a typical strain range that may occur during board level assembly, handling, and field installation. Finite Element Analysis may be conducted to derive the typical board strains that correlate to the strains with the failure strains in strain capacitor 135 and that can cause failures in circuit board 105 (e.g. like pad cratering.) As stated above, this strain threshold for circuit board 105 may be between 3,000 and 5,000με strain.

Figure 5:
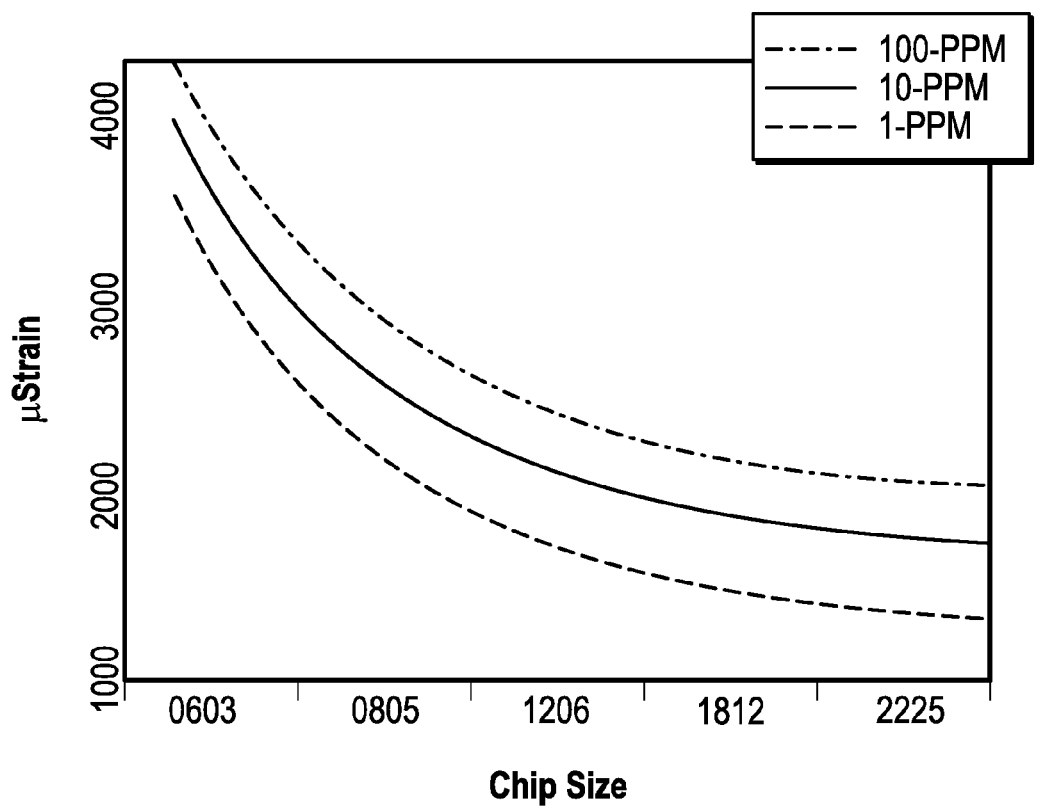
FIG. 5 shows a graph relating circuit board strain to commercially available ceramic capacitor sizes.

FIG. 5 shows a graph relating circuit board strain to commercially available (e.g. prefabricated, "off the shelf", etc.) ceramic capacitor sizes. As shown in FIG. 5, the strain threshold for circuit board 105 of between 3,000 and 5,000με may translate to commercially available capacitors of sizes between 1812 and 2225. If a DPPM of more than 100 is desired, a smaller capacitor can also be used. Capacitor design, mounting, and reflow guidelines for strain capacitor 135 may be the same as for standard ceramic capacitors.

Consequently, a known failure mode may be used to detect strain range. Ceramic capacitors are known to crack under flexural loading. For example, a 2225 capacitor may be selected for strain capacitor 135 to crack in the 3,000 to 5,000με strain range. As will be discussed below, failure of strain capacitor 135 may be detected by a strain monitor.

Once strain capacitor 135 is selected in stage 320, method 300 may continue to stage 330 where strain capacitor 135 may be mounted to circuit board 105. For example, strain capacitor 135 may be mounted in standard "keep out areas" around critical packages (e.g. package 110) so that no board (e.g. circuit board 105) space may be lost. Furthermore, strain capacitor 135 may be disposed in a high stress region of circuit board 105 (e.g., first high stress region 115, second high stress region 120, third high stress region 125, and fourth high stress region 130.) A high stress region may comprise a portion of circuit board 105 that may be more susceptible to damage due to straining or flexing circuit board 105 than other portions of circuit board 105.

Figure 6:
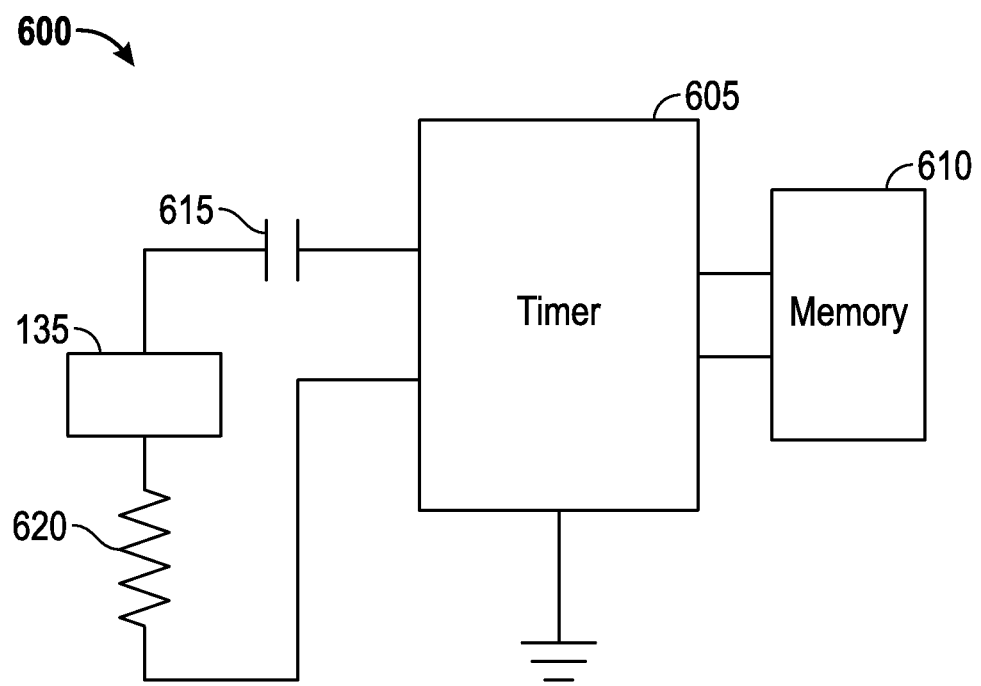
FIG. 6 shows a strain monitor.

After strain capacitor 135 is mounted to circuit board 105 in stage 330, method 300 may proceed to stage 340 where strain capacitor 135 may be monitored for failure. For example, strain capacitor 135 may be monitored using a strain monitor 600 as shown in FIG. 6. Strain monitor 600 may be mounted on circuit board 105 and may comprise a timer 605 and a memory 610. For example, timer 605 may comprise a 555 timer circuit and memory 610 may comprise an Electrically Erasable Programmable Memory. A circuit capacitor 615 and a circuit resistor 620 may be in series with strain capacitor 135.

A battery (not shown) may be included to power strain monitor 600 when circuit board 105 is not otherwise powered. The battery may allow strain monitor 600 to monitor strain capacitor 135, for example, during shipping and installation before circuit board 105 is powered by the system in which it is ultimately installed. Consistent with embodiments of the disclosure, memory 610 may be set to First In First Out (FIFO) to record a specific length of data (e.g. 60 minutes of data) with timer 605 constantly writing to memory 610. When the amount of data exceeds memory 610's size, earlier data written in memory 610 may be overwritten.

Crack 230 may form through electrodes 205 and ceramic dielectric 210 when circuit board 105 is subjected to a strain threshold while strain capacitor 135 is mounted on circuit board 105. Crack 230 may cause a detectible change in strain capacitor 135's capacitance. Strain monitor 600 may constantly be checking (e.g. measuring) strain capacitor 135's capacitance and comparing it to strain capacitor 135's know value. When strain capacitor 135's measured capacitance is different from strain capacitor 135's know value by a predetermined amount, this information is written to memory 610. Timer 605 may store the time of capacitance change in memory 610. At this time, timer 605 may stop writing to memory 610 so that the time capacitance changed is not written over.

Storing the most current information may indicate when strain capacitor 135 failed. Combining the knowledge of when strain capacitor 135 failed along with information as to where or what was going on with circuit board 105 at the failure time, may help determine what caused circuit board 105 to be over strained or over flexed to the point of capacitor 135's failure. Once strain capacitor 135 is monitored for failure in stage 340, method 300 may then end at stage 350.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
   determining a strain threshold for a circuit board, the strain threshold corresponds to an amount of flexing the circuit board will tolerate without failing at least one of the following: the circuit board; a solder joint on the circuit board; and a trace on the circuit board;
   selecting a strain capacitor that will fail when the circuit board is subjected to the strain threshold while the strain capacitor is mounted on the circuit board;
   mounting the strain capacitor to the circuit board; and
   monitoring the strain capacitor for failure.

2. The method of claim 1, wherein determining the strain threshold for the circuit board comprises determining the strain threshold between 3,000µε and 5,000µε inclusively.

3. The method of claim 1, wherein selecting the strain capacitor comprises selecting the strain capacitor comprising a ceramic capacitor.

4. The method of claim 1, wherein selecting the strain capacitor comprises selecting the strain capacitor comprising a ceramic strain capacitor in a commercially available size.

5. The method of claim 1, wherein selecting the strain capacitor comprises selecting the strain capacitor comprising a ceramic strain capacitor in a commercially available size between 1812 and 2225 inclusively.

6. The method of claim 1, wherein selecting the strain capacitor that will fail when the circuit board is subjected to the strain threshold while the strain capacitor is mounted on the circuit board comprises selecting the strain capacitor that will crack when the circuit board is subjected to the strain threshold while the strain capacitor is mounted on the circuit board.

7. The method of claim 1, wherein mounting the strain capacitor to the circuit board comprises mounting the strain capacitor in a high strain region on the circuit board.

8. The method of claim 1, wherein monitoring the strain capacitor for failure comprises determining that the strain capacitor has failed.

9. The method of claim 8, wherein monitoring the strain capacitor for failure comprises recording a time when the strain capacitor failed.

10. An apparatus comprising:
    a circuit board having a predetermined strain threshold wherein the predetermined strain threshold corresponds to an amount of flexing the circuit board will tolerate without failing at least one of the following: the circuit board; a solder joint on the circuit board; and a trace on the circuit board;
    a strain capacitor mounted to the circuit board, the strain capacitor comprising a commercially available ceramic strain capacitor and comprising a commercially available size that will fail by cracking when the circuit board is subjected to the predetermined strain threshold; and
    a monitor configured to detect when the strain capacitor fails.

11. The apparatus of claim 10, wherein the monitor is configured to record when the strain capacitor failed.

12. The apparatus of claim 10, wherein the monitor comprises:
    a memory; and
    a timer configured to record, in the memory, the time the strain capacitor failed.

13. The apparatus of claim 10, wherein the strain capacitor comprises a size between 1812 and 2225 inclusively.

14. The apparatus of claim 10, wherein the predetermined strain threshold is between 3,000µε and 5,000µε inclusively.

15. A method comprising:
monitoring a strain capacitor on a circuit board, the strain capacitor comprising a prefabricated ceramic strain capacitor and comprising a size that will fail when the circuit board is subjected to a predetermined strain threshold wherein the predetermined strain threshold corresponds to an amount of flexing the circuit board will tolerate without failing at least one of the following: the circuit board; a solder joint on the circuit board; and a trace on the circuit board;
determining that the strain capacitor has failed; and
recording a time when the strain capacitor failed.

16. The method of claim 15, wherein monitoring the strain capacitor on the circuit board comprises mounting the strain capacitor in a high strain region on the circuit board.

17. The method of claim 15, wherein monitoring the strain capacitor on the circuit board comprises monitoring the strain capacitor wherein the predetermined strain threshold comprises between 3,000 µε and 5,000 µε inclusively.

18. The method of claim 15, wherein determining that the strain capacitor has failed comprises determining that the strain capacitor has failed by a strain monitor located on the circuit board.

19. The method of claim 15, wherein recording the time when the strain capacitor failed comprises recording the time in a memory located on the circuit board.

* * * * *